(12) United States Patent
Doris et al.

(10) Patent No.: US 8,105,960 B2
(45) Date of Patent: *Jan. 31, 2012

(54) SELF-ASSEMBLED SIDEWALL SPACER

(75) Inventors: Bruce B. Doris, Brewster, NY (US); Carl J. Radens, LaGrangeville, NY (US)

(73) Assignee: International Business Machines Corporation, Armonk, NY (US)

(*) Notice: Subject to any disclaimer, the term of this patent is extended or adjusted under 35 U.S.C. 154(b) by 1148 days.

This patent is subject to a terminal disclaimer.

(21) Appl. No.: 11/869,178

(22) Filed: Oct. 9, 2007

(65) Prior Publication Data

US 2009/0093133 A1    Apr. 9, 2009

(51) Int. Cl.
*H01L 21/336* (2006.01)

(52) U.S. Cl. ............... 438/780; 438/230; 438/366

(58) Field of Classification Search ............ None
See application file for complete search history.

(56) References Cited

U.S. PATENT DOCUMENTS

| | | | |
|---|---|---|---|
| 7,808,020 B2 * | 10/2010 | Doris et al. ............ 257/288 |
| 2004/0256700 A1 | 12/2004 | Doris et al. | |
| 2005/0093104 A1 | 5/2005 | Ieong et al. | |
| 2005/0116290 A1 | 6/2005 | de Souza et al. | |
| 2005/0121750 A1 | 6/2005 | Chan et al. | |
| 2005/0260803 A1 | 11/2005 | Halik et al. | |
| 2008/0193658 A1 * | 8/2008 | Millward ............ 427/401 |

FOREIGN PATENT DOCUMENTS

WO    WO2006112887    10/2006

OTHER PUBLICATIONS

Jeff Pearse, Organic Spacer Technology, IP. Com Journal, IP.Com Inc., West Henrietta, NY, US, Dec. 31, 2001 XP013001492 ISSN: 1533-0001 p. 30.

* cited by examiner

*Primary Examiner* — Zandra Smith
*Assistant Examiner* — Pamela E Perkins
(74) *Attorney, Agent, or Firm* — Scully, Scott, Murphy & Presser, P.C.; Katherine S. Brown, Esq.

(57) ABSTRACT

A semiconductor structure is provided that includes a spacer directly abutting a topographic edge of at least one patterned material layer. The spacer is a non-removable polymeric block component of a self-assembled block copolymer. A method of forming such a semiconductor structure including the inventive spacer is also provided that utilizes self-assembled block copolymer technology.

19 Claims, 2 Drawing Sheets

SELF-ASSEMBLED SIDEWALL SPACER

RELATED APPLICATIONS

This application is related to U.S. Ser. No. 11/869,171, which cross referenced application is being filed concurrently on the same date as the present application.

FIELD OF THE INVENTION

The present invention relates to a nanostructure, particularly a semiconductor structure, and a method of fabricating the same. More particularly, the present invention relates to a nanostructure including at least one patterned region including at least one material and having a topographic edge that includes a sidewall spacer that is comprised of a polymeric block component of a self-assembled polymer as well as a method of fabricating such a structure utilizing self-assembled polymer technology.

BACKGROUND OF INVENTION

Field effect transistors (FETs) are the basic building block of today's integrated circuits. Such transistors can be formed in conventional bulk substrates (such as silicon) or in semiconductor-on-insulator (SOI) substrates.

State of the art FETs are fabricated by depositing a gate electrode over a gate dielectric and a substrate. Generally, the transistor fabrication process implements lithography and etching processes to define the conductive, e.g., polysilicon, gate structures. The gate structure and substrate are then typically, but not necessarily always, thermally oxidized, and, after this, source/drain extensions are formed by implantation. Sometimes the implant is performed using a source/drain extension spacer to create a specific distance between the gate and the implanted junction. In some instances, such as in the manufacture of an n-FET device, the source/drain extensions for the n-FET device are implanted with no source/drain extension spacer. For a p-FET device, the source/drain extensions are typically implanted with a source/drain extension spacer present. A thicker spacer than the source/drain extension spacer is typically formed after the source/drain extensions have been implanted. The deep source/drain implants are then performed with the thick spacer present. High temperature anneals are performed to activate the junctions after which the source/drain and top portion of the gate are generally silicided. Silicide formation typically requires that a refractory metal be deposited on a Si-containing substrate followed by a high temperature thermal anneal process to produce the silicide material. The silicide process forms low resistivity contacts to the deep source/drain regions and the gate conductor.

In the above, the thicker spacer provides self-aligned offset between the gate electrode (i.e., polysilicon or any other conductive material) and the implanted dopants which are used to tailor the semiconductor electrical characteristics of the FET.

In order make integrated circuits (ICs), such as memory, logic and other devices of higher integration than currently feasible one has to find a way to further downscale the dimensions of FETs. The downscaling of transistor dimensions allows for improved performance as well as compactness, but such downscaling has some device degrading effects. Generational improvements for high performance FET devices are obtained by decreasing the transistor line width, reducing the gate oxide thickness, and decreasing the source/drain extension resistance. Smaller transistor line width results in less distance between the source and the drain. This results in faster switching speeds for complementary metal oxide semiconductor (CMOS) circuits.

In addition to the above, the spacers used with the downscaled FET must also be downscaled accordingly in order to provide compact devices. However, conventional methods of forming a spacer which include deposition of a dielectric material, such as an oxide of silicon or a nitride of silicon, and anisotropic etching are becoming less practical as the scaling of the devices continues. The anisotropic etching step used in spacer formation is also undesirable since it typically modifies, removes and/or damages the various materials that are within the field of the FET.

It is noted that the above problems are not only related to FET devices. Instead, the aforementioned problems with conventional spacer formation and device scaling are present with any nanostructure which includes a spacer that abuts a topographic edge of a material or material stack present within the structure.

In view of the above, there is a need for providing new and improved spacers that can be used in various nanostructures to protect a topographic edge of a material or material stack present within the structure. In particular, a new and improved spacer is needed for protecting an edge of a gate stack structure.

SUMMARY OF THE INVENTION

The present invention provides a spacer that can be used in various nanostructures to protect a topographic edge of a material or material stack present within the structure. In particular, a spacer including a polymeric block component of a self-assembled block copolymer is used for protecting a topographic edge of a material or material stack. The inventive spacer may be a sacrificial spacer that can be removed in some applications or it may be a permanent spacer that remains in the structure.

In general terms, the present invention provides a nanostructure comprising:

a patterned region comprising at least one material layer and having at least one topographic edge; and a spacer directly abutting the topographic edge, said spacer comprising a polymeric block component of a self-assembled block copolymer.

In some embodiment of the present invention, the self-assembled block copolymer employed in the present invention is selected from the group consisting of polystyrene-block-polymethylmethacrylate (PS-b-PMMA), polystyrene-block-polyisoprene (PS-b-PI), polystyrene-block-polybutadiene (PS-b-PBD), polystyrene-block-polyvinylpyridine (PS-b-PVP), polystyrene-block-polyethyleneoxide (PS-b-PEO), polystyrene-block-polyethylene (PS-b-PE), polystyrene-b-polyorganosilicate (PS-b-POS), polystyrene-block-polyferrocenyldimethylsilane (PS-b-PFS), polyethyleneoxide-block-polyisoprene (PEO-b-PI), polyethyleneoxide-block-polybutadiene (PEO-b-PBD), polyethyleneoxide-block-polymethylmethacrylate (PEO-b-PMMA), polyethyleneoxide-block-polyethylethylene (PEO-b-PEE), polybutadiene-block-polyvinylpyridine (PBD-b-PVP), and polyisoprene-block-polymethylmethacrylate (PI-b-PMMA).

In a particular embodiment of the present invention, a nanostructure is provided that comprises:

a semiconductor substrate;

a patterned material stack comprising at least a patterned gate electrode, said patterned gate electrode having a topographic edge; and a spacer directly abutting said topographic edge, said spacer comprising a polymeric block component of a self-assembled block copolymer.

In addition to the semiconductor structures mentioned above, the present invention also provides a method of fabricating the inventive spacer which can be implemented into any conventional nanostructure processing flow. The spacer of the present invention is formed utilizing self-assembled block copolymer technology and, as such, it does not modify, damage and/or remove any materials present in the surrounding fields. Moreover, the inventive method does not utilize any anisoptropic etching technique in fabricating the spacer.

In general terms, the method of the present invention comprises:

providing a patterned region comprising at least one material layer and having at least one topographic edge; and forming a spacer directly abutting the topographic edge, said spacer comprising a polymeric block component of a self-assembled block copolymer.

More specifically, the spacer is formed by a process that includes applying a self-assembled block copolymer to the patterned region including the at least one material layer, annealing to form an ordered array of removable and unremovable polymeric components, and removing the removable polymeric components.

In another embodiment of the present invention, the method includes the steps of:

providing a patterned material stack comprising at least a patterned gate electrode on a surface of a semiconductor substrate, said patterned gate electrode having a topographic edge; and forming a spacer directly abutting said topographic edge, said spacer comprising a polymeric block component of a self-assembled block copolymer.

DETAILED DESCRIPTION OF THE INVENTION

Figure 1A:
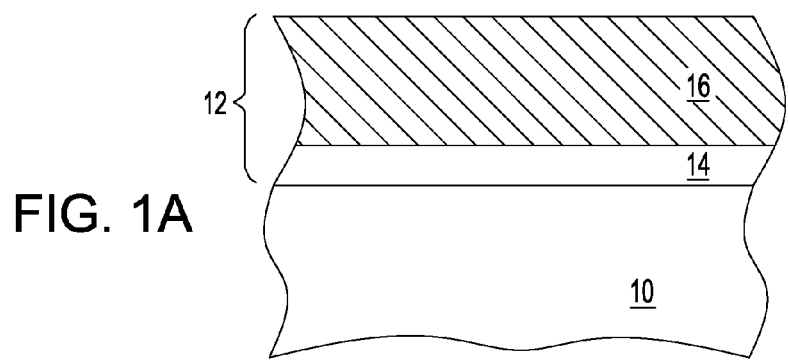
FIGS. 1A-1E are pictorial representation (through cross sectional views) depicting the basic processing steps used in accordance with the present invention.

The present invention, which provides a spacer for protecting a topographic edge of a material or material stack within a nanostructure and a method of fabricating the same, will now be described in greater detail by referring to the following discussion and drawings that accompany the present application. It is noted that the drawings of the present application are provided for illustrative purposes and, as such, they are not drawn to scale.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The following discussion represents a highly preferred embodiment of the present invention in which the inventive spacer is used in a FET structure. Although the inventive spacer is shown and is described in connection with a FET structure, the present invention is not limited to the FET application described and illustrated herein. Instead, the inventive spacer can be used in any nanostructure application in which a topographic edge of at least one material layer is to be protected with a directly abutting spacer. Other applications for the inventive spacer include, but are not limited to, a spacer for protecting a topographic edge of a capacitor structure, a spacer for protecting a topographic edge of a bipolar transistor structure, a spacer for protecting a topographic edge of an e-fuse, a spacer for protecting a topographic edge of a MEMS device, a spacer for protecting a topographic edge of an inductor, a spacer for protecting a topographic edge of a sensor, and a spacer for protecting a topographic edge of an optoelectronic device.

Reference is now made to FIGS. 1A-1E which illustrate the inventive spacer being implemented within a FET structure. The method of the present invention begins by first providing the initial structure shown in FIG. 1A which includes a material stack 12 comprising a gate dielectric 14 and a gate electrode 16 located on a surface of a semiconductor substrate 10.

The semiconductor substrate 10 of the initial structure shown in FIG. 1A comprises any semiconducting material including, but not limited to Si, Ge, SiGe, SiC, SiGeC, GaAs, GaN, InAs, InP and all other III/V or II/VI compound semiconductors. Semiconductor substrate 10 may also comprise an organic semiconductor or a layered semiconductor such as Si/SiGe, a silicon-on-insulator (SOI), a SiGe-on-insulator (SGOI) or a germanium-on-insulator (GOI). In some embodiments of the present invention, it is preferred that the semiconductor substrate 10 be composed of a Si-containing semiconductor material, i.e., a semiconductor material that includes silicon.

The semiconductor substrate 10 may be doped, undoped or contain doped and undoped regions therein. The semiconductor substrate 10 may include a single crystal orientation or it may include at least two coplanar surface regions that have different crystal orientations (the latter substrate is referred to in the art as a hybrid substrate). When a hybrid substrate is employed, the nFET is typically formed on a (100) crystal surface, while the pFET is typically formed on a (110) crystal plane. The hybrid substrate can be formed by techniques such as described, for example, in U.S. Patent Application Publication Nos. 2004/0256700 A1, 2005/0093104 A1, and 2005/0116290 A1, the entire contents of each are incorporated herein by reference.

The semiconductor substrate 10 may also include a first doped (n- or p-) region, and a second doped (n- or p-) region. For clarity, the doped regions are not specifically shown in the drawing of the present application. The first doped region and the second doped region may be the same, or they may have different conductivities and/or doping concentrations. These doped regions are known as "wells" and they are formed utilizing conventional ion implantation processes.

At least one isolation region (not shown) is then typically formed into the semiconductor substrate 10. The isolation region may be a trench isolation region or a field oxide isolation region. The trench isolation region is formed utilizing a conventional trench isolation process well known to those skilled in the art. For example, lithography, etching and filling of the trench with a trench dielectric may be used in forming the trench isolation region. Optionally, a liner may be formed in the trench prior to trench fill, a densification step may be performed after the trench fill and a planarization process may follow the trench fill as well. The field oxide may be formed utilizing a so-called local oxidation of silicon process. Note that the at least one isolation region provides isolation between neighboring gate regions, typically required when the neighboring gates have opposite conductivities, i.e., nFETs and pFETs. The neighboring gate regions can have the same conductivity (i.e., both n- or p-type), or alternatively they can have different conductivities (i.e., one n-type and the other p-type).

After processing the semiconductor substrate 10, an interfacial layer (not shown) is optionally formed on the surface of the semiconductor substrate 10. The interfacial layer is formed utilizing a conventional growing technique that is well known to those skilled in the art including, for example, oxidation or oxynitridation. When the substrate 10 is a Si-containing semiconductor, the interfacial layer is comprised of silicon oxide, silicon oxynitride or a nitrided silicon oxide. When the substrate 10 is other than a Si-containing semiconductor, the interfacial layer may comprise a semiconducting oxide, a semiconducting oxynitride or a nitrided semiconducting oxide. The thickness of the interfacial layer is typically from about 0.5 to about 1.2 nm, with a thickness from about 0.8 to about 1 nm being more typical. The thickness, however, may be different after processing at higher temperatures, which are usually required during CMOS fabrication.

Next, a gate dielectric 14 can be formed on the surface of the interfacial layer, if present, or a surface of the semiconductor structure 10, if the interfacial layer is not present, by a deposition process such as, for example, chemical vapor deposition (CVD), plasma-assisted CVD, physical vapor deposition (PVD), metalorganic chemical vapor deposition (MOCVD), atomic layer deposition (ALD), evaporation, reactive sputtering, chemical solution deposition and other like deposition processes. In some embodiments of the present invention, the gate dielectric 14 can be formed by a thermal growing process such as, for example, thermal oxidation or thermal nitridation. The gate dielectric 14 may also be formed utilizing any combination of the above processes.

The gate dielectric 14 includes any conventional dielectric material including an oxide, a nitride, an oxynitride or any combination including multilayers thereof. Generally, but not necessarily always, the gate dielectric 14 is an oxide of silicon, a nitride of silicon or an oxynitride of silicon. In other embodiments, the gate dielectric 14 is a high k gate dielectric. The term "high k gate dielectric" as used herein refers to a dielectric material whose dielectric constant is greater than 4.0, preferably greater than 7.0. Examples of such high k gate dielectric materials include, but are not limited to $TiO_2$, $Al_2O_3$, $ZrO_2$, $HfO_2$, $Ta_2O_5$, $La_2O_3$, mixed metal oxides such a perovskite-type oxides, and combinations and multilayers thereof. Silicates and nitrides of the aforementioned metal oxides can also be used as the high k gate dielectric material.

The physical thickness of the gate dielectric 14 may vary, but typically, the gate dielectric 14 has a thickness from about 0.5 to about 10 nm, with a thickness from about 0.5 to about 3 nm being more typical.

Following the formation of the gate dielectric 14, a gate electrode 16 is formed atop the gate dielectric 14. Specifically, a blanket layer of a conductive material is formed on the gate dielectric 14 utilizing a known deposition process such as, for example, physical vapor deposition, CVD or evaporation. The conductive material used as the gate electrode 16 includes, but is not limited to Si-containing materials such as Si or a SiGe alloy layer in either single crystal, polycrystalline or amorphous form. The conductive material may also be a conductive metal, a conductive metal alloy and/or a conductive metal nitride. Combinations of the aforementioned conductive materials are also contemplated herein. Si-containing materials are preferred as the gate electrode 16, with polySi being most preferred.

In addition to aforementioned conductive materials, the present invention also contemplates instances wherein the gate electrode 16 is fully silicided or a stack including a combination of a silicide and Si or SiGe. The silicide is made using a conventional silicidation process well known to those skilled in the art. Fully silicided gates can be formed using a conventional replacement gate process; the details of which are not critical to the practice of the present invention.

The blanket layer of conductive gate material may be doped or undoped. If doped, an in-situ doping deposition process may be employed in forming the same. Alternatively, a doped gate electrode can be formed by deposition, ion implantation and annealing. The ion implantation and annealing can occur prior to or after a subsequent etching step that patterns the material stack. The doping of the gate electrode 16 will shift the workfunction of the gate conductor formed. Illustrative examples of dopant ions for nMOSFETs include elements from Group VA of the Periodic Table of Elements (Group IIIA elements can be used when pMOSFETs are formed).

The thickness, i.e., height, of the gate electrode 16 deposited at this point of the present invention may vary depending on the deposition process employed. Typically, the gate electrode 16 has a vertical thickness from about 20 to about 180 nm, with a thickness from about 40 to about 150 nm being more typical.

In some embodiments, not shown, a dielectric hard mask is formed atop the gate electrode 16. When present, the dielectric hard mask is comprised of an oxide, a nitride or oxynitride, with an oxide of silicon or a nitride of silicon being highly preferred material for the dielectric hard mask. The dielectric hard mask serves to protect the gate electrode from some further processing steps of the FET fabrication. The dielectric hard mask is formed by a conventional deposition process (such as, for example, chemical vapor deposition, plasma enhanced chemical vapor deposition, atomic layer deposition). Alternatively, the dielectric hard mask can be formed by a thermal process such as, for example, oxidation.

Figure 1B:
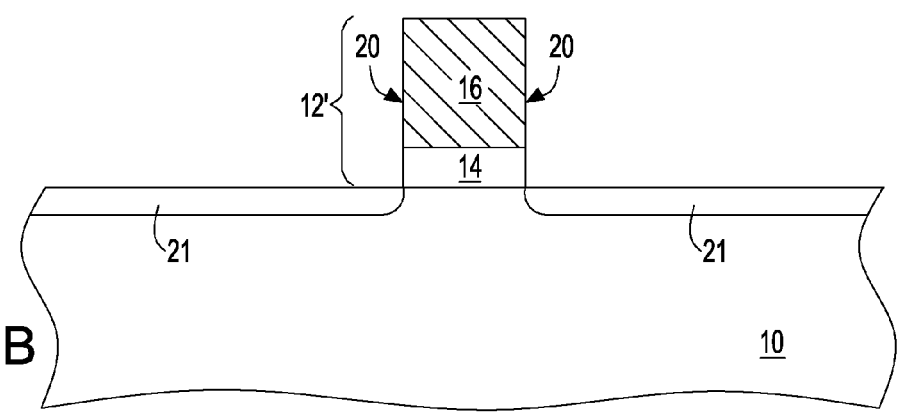

After forming the initial structure shown in FIG. 1A, at least the gate electrode 16 of the material 12 is patterned by lithography and etching. FIG. 1B illustrates the structure that is formed after this patterning step has been performed. In the embodiment shown, both the gate electrode 16 and the gate dielectric 14 of the material stack 12 are patterned by this step of the present invention. It is noted that although a single patterned material stack 12' is shown in the drawings, the present invention is not limited to only that number of patterned gate stacks. Typically, at least one neighboring patterned material stack is formed adjacent to the patterned material stack 12' shown in FIG. 1B.

The lithographic step includes applying a photoresist material to the exposed upper surface of the material stack, exposing the photoresist material to a pattern of radiation and developing the exposed photoresist utilizing a conventional resist developer. The developed resist can be removed from the structure anytime after the pattern has been transferred into one of the layers of the material stack 12. A conventional stripping process such as, for example, ashing, can be used to remove the patterned resist after the initial pattern has been transferred.

The etching step mentioned above comprises a dry etching process (i.e., reactive ion etching, ion beam etching, plasma etching and/or laser ablation), a chemical wet etchant process or a combination of dry and wet etching can be used.

It is noted that although the above processing steps are described in fabricating the structure shown in FIG. 1B, the structure shown in FIG. 1B can be arrived at by utilizing a conventional gate replacement process. As such, the present invention is not limited to only the method described and illustrated above for forming the structure shown in FIG. 1B.

As shown in FIG. 1B, a structure is provided in which a bare topographic edge 20 of a patterned material stack 12' is formed. It is noted that although the patterned material stack 12' is illustrated as containing both a patterned gate electrode and a patterned gate dielectric, the present invention works equally well in cases in which the pattern region includes only a single material layer or when the patterned region includes more than two material layers.

At this point of the present invention, the source/drain extension regions 21 are typically formed utilizing an ion implantation process well known to those skilled in the art. Typically, the extension implantation is performed in the absence of sidewall spacers such that the inner edge of the extension region 21 is aligned to the outer edge (i.e., topographic edge 20) of the patterned gate electrode. After this ion implantation step, an optional anneal process may be performed to active the dopants that are implanted during the ion implantation process. The anneal may also be performed later on in the inventive process. For example, after ion implantation of the source/drain diffusion regions or during the metal semiconductor alloy formation.

If not previous performed, exposed portions of the gate dielectric 14, not covered by the patterned gate electrode 16 can be removed. It is also possible to remove the exposed positions of the gate dielectric 14 following formation of the inventive spacer.

A layer of a self-assembled block copolymer is applied to the structure shown in FIG. 1B and then annealed to form an ordered pattern containing repeating structural units. The height of the layer of self-assembled block copolymer has a thickness that is substantially the same as the thickness of the gate electrode 16. Thus, the self-assembled block copolymer does not extend above the uppermost surface of the patterned material stack 12'. The topographic edge 20 of at least the patterned gate electrode 16 serves as a mandrel for retaining the block copolymer within the area that is required to be patterned.

There are many different types of block copolymers that can be used for practicing the present invention. As long as a block copolymer contains two or more different polymeric block components that are not miscible with one another, such two or more different polymeric block components are capable of separating into two or more different phases on a nanometer scale and thereby form patterns of isolated nano-sized structural units under suitable conditions.

In a preferred, but not necessary, embodiment of the present invention, the block copolymer consists essentially of first and second polymeric block components A and B that are immiscible with each other. The block copolymer may contain any numbers of the polymeric block components A and B arranged in any manner. The block copolymer can have either a linear or a branched structure. Preferably, such a block polymer is a linear diblock copolymer having the formula of A-B. Further, the block copolymer can have any one of the following formula:

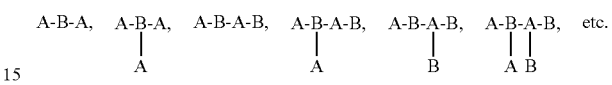

Specific examples of suitable block copolymers that can be used for forming the structural units of the present invention may include, but are not limited to polystyrene-block-polymethylmethacrylate (PS-b-PMMA), polystyrene-block-polyisoprene (PS-b-PI), polystyrene-block-polybutadiene (PS-b-PBD), polystyrene-block-polyvinylpyridine (PS-b-PVP), polystyrene-block-polyethyleneoxide (PS-b-PEO), polystyrene-block-polyethylene (PS-b-PE), polystyrene-b-polyorganosilicate (PS-b-POS), polystyrene-block-polyferrocenyldimethylsilane (PS-b-PFS), polyethyleneoxide-block-polyisoprene (PEO-b-PI), polyethyleneoxide-block-polybutadiene (PEO-b-PBD), polyethyleneoxide-block-polymethylmethacrylate (PEO-b-PMMA), polyethyleneoxide-block-polyethylethylene (PEO-b-PEE), polybutadiene-block-polyvinylpyridine (PBD-b-PVP), and polyisoprene-block-polymethylmethacrylate (PI-b-PMMA).

The specific structural units formed by the block copolymer are determined by the molecular weight ratio between the first and second polymeric block components A and B. For example, when the ratio of the molecular weight of the first polymeric block component A over the molecular weight of the second polymeric block component B is greater than about 80:20, the block copolymer will form an ordered array of spheres composed of the second polymeric block component B in a matrix composed of the first polymeric block component A. When the ratio of the molecular weight of the first polymeric block component A over the molecular weight of the second polymeric block component B is less than about 80:20 but greater than about 60:40, the block copolymer will form an ordered array of cylinders composed of the second polymeric block component B in a matrix composed of the first polymeric block component A. When the ratio of the molecular weight of the first polymeric block component A over the molecular weight of the second polymeric block component B is less than about 60:40 but is greater than about 40:60, the block copolymer will form alternating lamellae composed of the first and second polymeric block components A and B. Therefore, the molecular weight ratio between the first and second polymeric block components A and B can be readily adjusted in the block copolymer of the present invention, in order to form desired structural units.

In a preferred embodiment of the present invention, the ratio of the molecular weight of the first polymeric block component A over the molecular weight of the second polymeric block component B ranges from about 80:20 to about 60:40, so that the block copolymer of the present invention will form an ordered array of lines composed of the second polymeric block component B in a matrix composed of the first polymeric block component A.

Preferably, one of the components A and B can be selectively removable relative to the other, thereby resulting in either isolated and orderly arranged structural units composed of the un-removed component, or a continuous structural layer containing isolated and orderly arranged cavities or trenches left by the removable component.

Figure 1C:
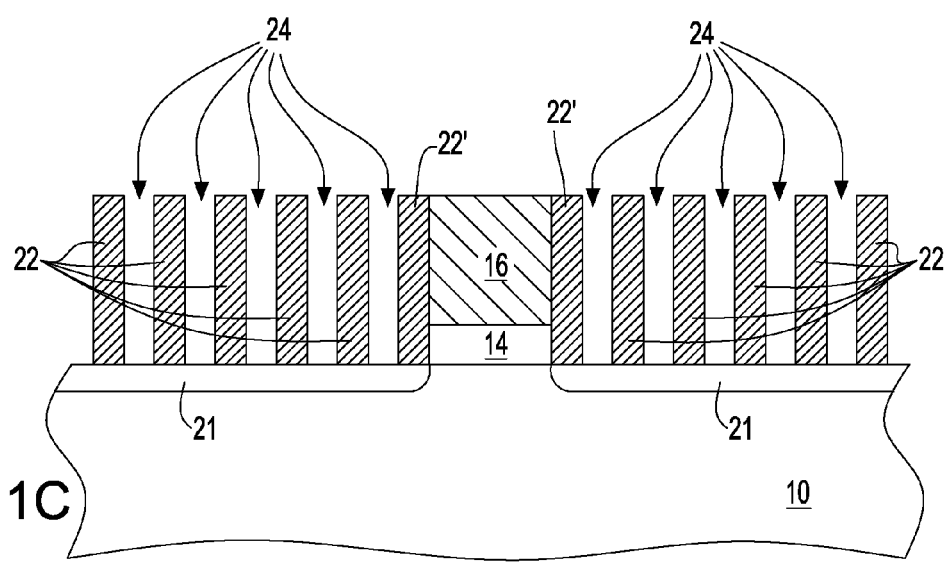

In FIG. 1C, the unremovable component of the block copolymer is labeled as reference numeral 22, while the trenches created by the removable component of the block copolymer is labeled as reference numeral 24. It is noted that although the instant embodiment illustrates the formation of a line/space pattern, the present invention is not limited to the same. Since self-assembled block copolymers are used in the inventive method each repeating unit has a width of about 50 nm or less. Other types of patterns that can be patterned/formed include, for example, spheres, cylinders, or lamellae.

In a particularly preferred embodiment of the present invention, the block copolymer used for forming the self-assembled periodic patterns of the present invention is PS-b-PMMA with a PS:PMMA molecular weight ratio ranging from about 80:20 to about 60:40.

Typically, mutual repulsion between different polymeric block components in a block copolymer is characterized by the term $\chi N$, where $\chi$ is the Flory-Huggins interaction parameter and N is the degree of polymerization. The higher $\chi N$, the higher the repulsion between the different blocks in the block copolymer, and the more likely the phase separation therebetween. When $\chi N > 10$ (which is hereinafter referred to as the strong segregation limit), there is a strong tendency for the phase separation to occur between different blocks in the block copolymer.

For a PS-b-PMMA diblock copolymer, $\chi$ can be calculated as approximately $0.028 + 3.9/T$, where T is the absolute temperature. Therefore, $\chi$ is approximately 0.0362 at 473K ($\approx 200°$ C.). When the molecular weight ($M_n$) of the PS-b-PMMA diblock copolymer is approximately 64K g/mol, with a molecular weight ratio (PS:PMMA) of approximately 66:34, the degree of polymerization N is about 622.9, so $\chi N$ is approximately 22.5 at 200° C.

In this manner, by adjusting one or more parameters such as the composition, the total molecular weight, and the annealing temperature, the mutual compulsion between the different polymeric block components in the block copolymer of the present invention can be readily controlled to effectuate desired phase separation between the different block components. The phase separation in turn leads to formation of self-assembled periodic patterns containing ordered arrays of repeating structural units (i.e., spheres, lines, cylinders, or lamellae), as described hereinabove.

In order to form the self-assembled periodic patterns, the block copolymer is first dissolved in a suitable solvent system to form a block copolymer solution, which is then applied onto a surface to form a thin block copolymer layer, followed by annealing of the thin block copolymer layer, thereby effectuating phase separation between different polymeric block components contained in the block copolymer.

The solvent system used for dissolving the block copolymer and forming the block copolymer solution may comprise any suitable solvent, including, but not limited to toluene, propylene glycol monomethyl ether acetate (PGMEA), propylene glycol monomethyl ether (PGME), and acetone. The block copolymer solution preferably contains the block copolymer at a concentration ranging from about 0.1% to about 2% by total weight of the solution. More preferably, the block copolymer solution contains the block copolymer at a concentration ranging from about 0.5 wt % to about 1.5 wt %. In a particularly preferred embodiment of the present invention, the block copolymer solution comprises about 0.5 wt % to about 1.5 wt % PS-b-PMMA dissolved in toluene or PGMEA.

The block copolymer solution can be applied to the surface of a device structure by any suitable techniques, including, but not limited to spin casting, coating, spraying, ink coating, dip coating, etc. Preferably, the block copolymer solution is spin cast onto the surface of a device structure to form a thin block copolymer layer thereon.

After application of the thin block copolymer layer onto the device surface, the entire device structure is annealed to effectuate micro-phase segregation of the different block components contained by the block copolymer, thereby forming the periodic patterns with repeating structural units.

The annealing of the block copolymer can be achieved by various methods known in the art, including, but not limited to thermal annealing (either in a vacuum or in an inert atmosphere containing nitrogen or argon), ultra-violet annealing, laser annealing, solvent vapor-assisted annealing (either at or above room temperature), and supercritical fluid-assisted annealing, which are not described in detail here in order to avoid obscuring the invention.

In a particularly preferred embodiment of the present invention, a thermal annealing step is carried out to anneal the block copolymer layer at an elevated annealing temperature that is above the glass transition temperature ($T_g$) of the block copolymer, but below the decomposition or degradation temperature ($T_d$) of the block copolymer. More preferably, the thermal annealing step is carried out an annealing temperature of about 200° C.-300° C. The thermal annealing may last from less than about 1 hour to about 100 hours, and more typically from about 1 hour to about 15 hours.

In an alternative embodiment of the present invention, the block copolymer layer is annealed by ultra-violet (UV) treatment.

Following the anneal process, one of the components of the block copolymer can be removed utilizing a solvent that is selective to that component relative to the other component of the block copolymer. The type of solvent may vary and can be, for example, selected from the following list: polar and aprotic solvents.

After removing the removable component of the block copolymer, the remaining "unremovable" component that is directly abutting the topographic edge 20 serves as a spacer. In FIG. 1C, reference numeral 22' denotes the spacer of the present invention.

Since self-assembled polymer technology is used in the inventive process, the width, W, of each spacer 22' as measured from a bottom portion that is atop the semiconductor substrate 10 is less than 50 nm, with a width from about 10 to about 40 nm being more typical.

Figure 1D:
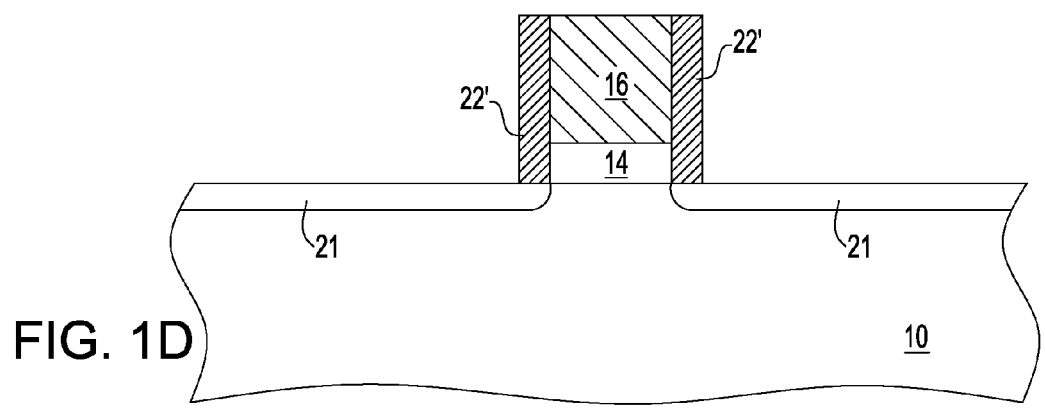

At this point of the present invention, a block mask (not shown) can be formed atop each of the patterned materials stacks 12' including spacer 22' and then a conventional stripping process can be used to remove the unremovable block copolymer component 22 from the structure providing the structure shown, for example, in FIG. 1D. It should be noted that the use of a block mask is applicable for the embodiment illustrated and that in other embodiments no block mask is needed.

Figure 1E:
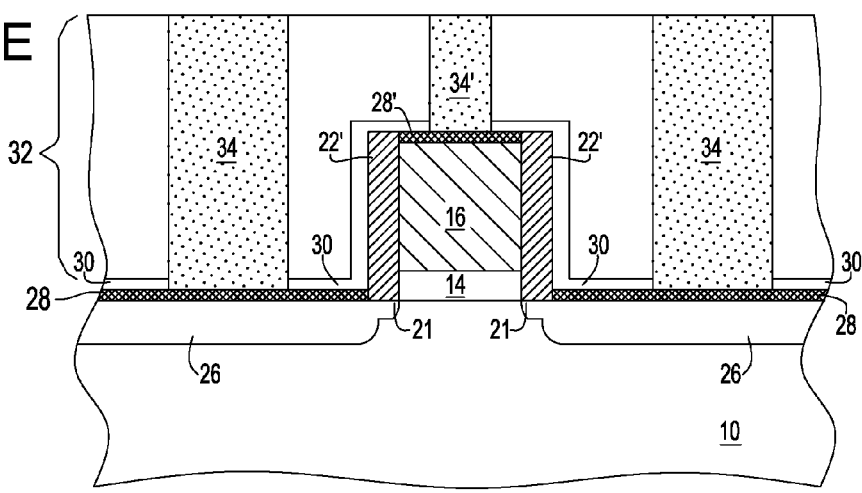

Next, conventional CMOS processing steps are performed to provide the structure illustrated in FIG. 1E. Specifically, source/drain diffusion regions 26 are formed into the surface of the semiconductor substrate 10 utilizing a conventional ion implantation process. Halo implants may optionally be performed at this time of inventive process. Following the formation of the source/drain diffusion regions 26, an anneal process may be used to active the dopants that were implanted into the semiconductor substrate 10. The anneal may also be delayed and can be performed during a later thermal event of the inventive process, e.g., during formation of the metal semiconductor alloy.

Next, a metal semiconductor alloy layer 28 is formed on the source/drain diffusion regions 26. The term "metal semiconductor alloy" is used herein to denote a reaction product that is formed from thermally reacting a metal with a semiconductor material. For example, the term "metal semiconductor alloy" can be used to describe a metal silicide wherein the metal is one of Ti, W, Co, Ni, Pt, Pd, Er, Ir and other rare earth or transition metals. It could also be an alloy consisting of a combination of two or more these metals. Typically, the metal is one of Ti, W, Co and Ni. The term "metal semiconductor alloy" also describes a metal germanide including one of the above metals.

The metal semiconductor alloy layer 28 is formed by first depositing a metal that is capable of thermally reacting with a semiconductor material atop the structure shown in FIG. 1D. The metal is typically one of Ti, W, Co, Ni, Pt and Pd, with one of Ti, W, Co and Ni being more preferred. The metal may include an alloying additive such as, for example, C, Al, Si, Sc, Ti, V, Cr, Mn, Fe, Co, Ni, Cu, Ge, Y, Zr, Nb, Mo, Ru, Rh, Pd, In, Sn, La, Hf, Ta, W, Re, Ir, Pt, Ce, Pr, Nd, Sm, Eu, Gd, Tb, Dy, Ho Tm, Yb, Lu and mixtures thereof. When present, the alloying additive is present in amounts up to about 50 atomic percent. The metal is formed by a conventional deposition process including, for example, chemical vapor deposition, plasma enhanced chemical vapor deposition, plating, sputtering, chemical solution deposition, atomic layer deposition, physical vapor deposition and other like techniques. The alloying additive can be formed at the same time as the metal or it can be adding to the metal after deposition thereof, or it can be co-deposited atop the metal in a separate layer.

The thickness of the deposited metal can vary depending on the junction depth relative to the final thickness of the silicide formed at the upper bound and the desired resistivity at the lower bound. Typically, and for applications in FETs, the metal that is deposited has a thickness from about 5 to about 15 nm.

Following formation of the metal, an optional diffusion barrier such as TiN or TaN may be formed atop the metal prior to annealing. Annealing is performed under conditions that are sufficient in causing the metal and semiconductor to react together forming a metal semiconductor alloy layer, i.e., a metal silicide or a metal germanide. The anneal may be performed in a single step or a two-step anneal process can be used. The anneal is performed at a temperature of about 300° C. or greater, with a temperature from about 400° to about 700° C. being more typical. The optional diffusion barrier is removed after the single anneal process or after the first anneal of the two-step anneal utilizing a conventional process well known to those skilled in the art. Annealing can be performed in a forming gas, He, Ar, or $N_2$. The anneal includes a furnace anneal, a rapid thermal anneal, a spike anneal, a microwave anneal or a laser anneal. Typically, the anneal is a rapid thermal anneal in which the anneal time is about typically less than a minute. Following the final anneal step, any unreacted metal is removed from the structure.

Note that when the gate electrode 16 is composed of a Si-containing conductive material, i.e., polysilicon or silicon germanium, a metal semiconductor alloy layer 28' can also form on an upper surface of the gate electrode 16. In embodiments in which a dielectric hard mask is present and remains in the structure during the formation of the metal semiconductor alloy layer, no such metal semiconductor alloy layer is formed atop the gate electrode 16.

A dielectric liner 30 comprising an oxide, nitride, oxynitride or combination thereof is typically, but not necessarily always, formed over the structure. The dielectric liner 30 can be used to introduce stress into the device channel; the device channel, as is known to those skilled in the art, is the region of the semiconductor substrate that is beneath the gate conductor which is laterally confined by the device's source region on one side, and by the device's drain region on the other side. The dielectric liner 30 is formed utilizing a conventional deposition well known to those skilled in the art and the thickness of the dielectric liner is typically from about 20 to about 100 nm.

Next, an interconnect dielectric material 32 is formed by deposition (typically by chemical vapor deposition, plasma enhanced chemical vapor deposition or spin-on coating) and openings are formed into the interconnect dielectric material 32 by lithography and etching. The interconnect dielectric material 32 includes any dielectric material having a dielectric constant, relative to vacuum, that is about 4.0 or less. Some examples of suitable dielectrics that can be used as the interconnect dielectric material 32 include, but are not limited to: $SiO_2$, silsesquioxanes, C doped oxides (i.e., organosilicates) that include atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

The openings are typically lined with a diffusion barrier material such as, for example, Ti, Ta, W TaN, TiN or WN, and thereafter the openings are filled (by, for example, plating) with a conductive material such as for example, W, Al, Cu or a AlCu alloy. The openings that extend to the source/drain diffusion regions are referred to as the diffusion contacts and they are labeled in the drawings by reference numeral 34. A contact 34' to the gate electrode 16 is typically also formed.

As mentioned above the previous discussion represents a highly preferred embodiment of the present invention in which the inventive spacer is used in a FET structure. Although the inventive spacer is shown and is described in connection with a FET structure, the present invention is not limited to the FET application described and illustrated herein. Instead, the inventive spacer can be used in any nanostructure application in which a topographic edge of at least one material layer is to be protected with a directly abutting spacer. Other applications for the inventive spacer include, for example, those mentioned above.

Figures 2A, 2B:
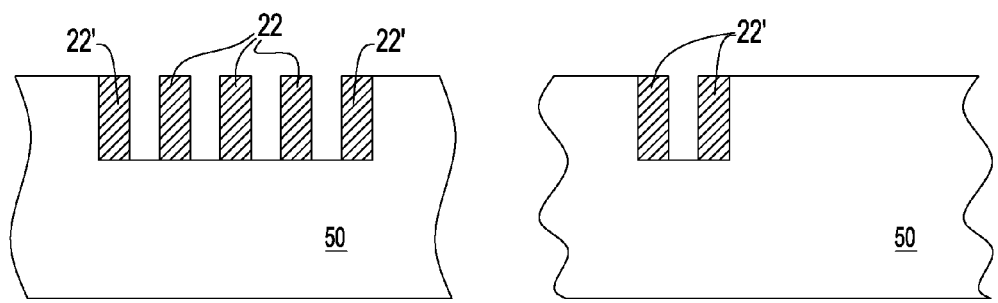
FIGS. 2A-2B are pictorial representations (through cross sectional views) depicting two additional embodiments of the present invention in which self-assembly technology is used to provide a spacer abutting a topographic edge of a material layer or material stack.

Reference is now made to FIGS. 2A-2B in which other structural embodiments of the present invention are shown. Specifically, FIG. 2A shows an embodiment in which at least one wide opening (having an aspect ratio of trench height to trench width of greater than 1:3) is formed into a material layer or material stack (reference numeral 50) by lithography and etching and thereafter the above self-assembly technology is employed. In this drawing, the unremovable component of the block copolymer is labeled as reference numeral 22, and the spacer (comprised also of the unremovable component of the block copolymer) that is abutting the topographic edge of the material layer or material stack is labeled as 22'. The material layer or material stack may comprise a semiconducting material, an insulating material, a conductive material or any multilayered combination thereof. FIG. 2B shows an embodiment in which at least one narrow opening (having an aspect ratio of trench height to trench width of less than 1:1) is formed into a material layer or material stack (reference numeral 50) by lithography and etching and thereafter the above self-assembly technology is employed. In this drawing, the spacer comprised of the unremovable component of the block copolymer that is abutting the topographic edge of the material layer or material stack is labeled as 22'. The material layer or material stack may comprise a semiconducting material, an insualting material, a conductive material or any multilayered combination thereof.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of fabricating a semiconductor structure comprising:
   providing a patterned gate structure comprising at least one gate dielectric layer on a channel region of a semiconductor substrate, and at least one gate conductor material layer on the at least one gate dielectric layer, wherein the at least one gate conductor material layer has at least one topographic edge; and
   forming a spacer directly abutting a sidewall of the at least one gate dielectric layer, a sidewall of the at least one gate conductor material layer, and the at least one topographic edge, said spacer comprising a polymeric block component of a self-assembled block copolymer.

2. The method of claim 1 wherein said providing said patterned region includes a lithographic patterning process.

3. The method of claim 1 wherein said self-assembled block copolymer is selected from the group consisting of polystyrene-block-polymethylmethacrylate (PS-b-PMMA), polystyrene-block-polyisoprene (PS-b-PI), polystyrene-block-polybutadiene (PS-b-PBD), polystyrene-block-polyvinylpyridine (PS-b-PVP), polystyrene-block-polyethyleneoxide (PS-b-PEO), polystyrene-block-polyethylene (PS-b-PE), polystyrene-b-polyorganosilicate (PS-b-POS), polystyrene-block-polyferrocenyldimethylsilane (PS-b-PFS), polyethyleneoxide-block-polyisoprene (PEO-b-PI), polyethyleneoxide-block-polybutadiene (PEO-b-PBD), polyethyleneoxide-block-polymethylmethacrylate (PEO-b-PMMA), polyethyleneoxide-block-polyethylethylene (PEO-b-PEE), polybutadiene-block-polyvinylpyridine (PBD-b-PVP), and polyisoprene-block-polymethylmethacrylate (PI-b-PMMA).

4. The method of claim 1 wherein said forming said spacer comprises applying a self-assembled block copolymer in an area adjoining said patterned region, annealing to form an ordered array of removable and unremovable polymeric components, and removing said removable polymeric components.

5. The method of claim 4 wherein said applying comprises spin casting, coating, spraying, ink coating or dip coating.

6. The method of claim 5 wherein said applying is spin casting a block copolymer solution.

7. The method of claim 4 wherein said annealing comprises thermal annealing, ultra-violet annealing, laser annealing, solvent vapor-assisted annealing or supercritical fluid-assisted annealing.

8. The method of claim 7 wherein said annealing is thermal annealing that is performed at a temperature from about 200° to about 300° C.

9. The method of claim 1 wherein said spacer has a width as measured at a bottommost portion thereof of less than 50 nm.

10. The method of claim 9 wherein said width is from about 10 to about 40 nm.

11. A method of forming a semiconductor structure comprising:
    providing a patterned material stack directly on a channel region of a semiconductor substrate, the patterned material stack comprising at least a patterned gate electrode having a topographic edge; and
    forming a spacer directly abutting a sidewall of the patterned gate electrode and said topographic edge, said spacer having an upper surface that is coplanar with an upper surface of said topographical edge, said spacer comprising a polymeric block component of a self-assembled block copolymer.

12. The method of claim 11 wherein said self-assembled block copolymer is selected from the group consisting of polystyrene-block-polymethylmethacrylate (PS-b-PMMA), polystyrene-block-polyisoprene (PS-b-PI), polystyrene-block-polybutadiene (PS-b-PBD), polystyrene-block-polyvinylpyridine (PS-b-PVP), polystyrene-block-polyethyleneoxide (PS-b-PEO), polystyrene-block-polyethylene (PS-b-PE), polystyrene-b-polyorganosilicate (PS-b-POS), polystyrene-block-polyferrocenyldimethylsilane (PS-b-PFS), polyethyleneoxide-block-polyisoprene (PEO-b-PI), polyethyleneoxide-block-polybutadiene (PEO-b-PBD), polyethyleneoxide-block-polymethylmethacrylate (PEO-b-PMMA), polyethyleneoxide-block-polyethylethylene (PEO-b-PEE), polybutadiene-block-polyvinylpyridine (PBD-b-PVP), and polyisoprene-block-polymethylmethacrylate (PI-b-PMMA).

13. The method of claim 11 wherein said forming said spacer comprises applying a self-assembled block copolymer in an area adjoining said patterned material stack, annealing to form an ordered array of removable and unremovable polymeric components, and removing said removable polymeric components.

14. The method of claim 13 wherein said applying comprises spin casting, coating, spraying, ink coating or dip coating.

15. The method of claim 14 wherein said applying is spin casting a block copolymer solution.

16. The method of claim 13 wherein said annealing comprises thermal annealing, ultra-violet annealing, laser annealing, solvent vapor-assisted annealing or supercritical fluid-assisted annealing.

17. The method of claim 16 wherein said annealing is thermal annealing that is performed at a temperature from about 200° to about 300° C.

18. The method of claim 11 wherein said spacer has a width as measured at a bottommost portion thereof of less than 50 nm.

19. The method of claim 18 wherein said width is from about 10 to about 40 nm.

* * * * *